United States Patent
Li et al.

(10) Patent No.: US 12,075,666 B2
(45) Date of Patent: Aug. 27, 2024

(54) TRANSPARENT OLED DISPLAY PANEL, DISPLAY APPARATUS AND MANUFACTURING METHOD

(71) Applicants: Hefei Xinsheng Optoelectronics Technology Co., Ltd., Hefei (CN); BOE Technology Group Co., Ltd., Beijing (CN)

(72) Inventors: Meng Li, Beijing (CN); Yongqian Li, Beijing (CN); Song Meng, Beijing (CN); Can Yuan, Beijing (CN); Zhidong Yuan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 505 days.

(21) Appl. No.: 17/416,498

(22) PCT Filed: Oct. 19, 2020

(86) PCT No.: PCT/CN2020/121945
§ 371 (c)(1),
(2) Date: Jun. 20, 2021

(87) PCT Pub. No.: WO2021/078104
PCT Pub. Date: Apr. 29, 2021

(65) Prior Publication Data
US 2022/0045161 A1 Feb. 10, 2022

(30) Foreign Application Priority Data
Oct. 22, 2019 (CN) .......................... 201911008550.7

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1213* (2023.02); *H10K 59/352* (2023.02);
(Continued)

(58) Field of Classification Search
CPC ............. H10K 59/131; H10K 59/1213; H10K 59/352; H10K 59/353; H10K 71/00;
(Continued)

(56) References Cited

U.S. PATENT DOCUMENTS

2005/0116615 A1 6/2005 Matsumoto et al.
2006/0119556 A1 6/2006 Winters et al.
(Continued)

FOREIGN PATENT DOCUMENTS

CN 1728207 A 2/2006
CN 101251986 A 8/2008
(Continued)

OTHER PUBLICATIONS

CN201911008550.7 first office action.
(Continued)

*Primary Examiner* — Jonathan Han
(74) *Attorney, Agent, or Firm* — IPro, PLLC

(57) ABSTRACT

A transparent OLED display panel, a manufacturing method therefor, and a display apparatus are provided, relating to the field of display technologies. The display panel has a plurality of transparent regions and a plurality of display regions, wherein the transparent regions and the display regions are alternately arranged in a first direction. The display panel includes a plurality of pixels arranged in a second direction and a plurality of data lines; each of the
(Continued)

pixels includes a plurality of sub-pixels, and the sub-pixels in each display region include a row of first sub-pixels and a row of second sub-pixels both arranged in the second direction; and the pixel at least includes one first sub-pixel and one second sub-pixel adjacent to each other. In the same display region, one first sub-pixel and one second sub-pixel adjacent to each other in the first direction are connected to the same data line.

20 Claims, 10 Drawing Sheets

(51) Int. Cl.
    *H10K 59/121*     (2023.01)
    *H10K 59/35*     (2023.01)
    *H10K 71/00*     (2023.01)

(52) U.S. Cl.
    CPC ........... *H10K 59/353* (2023.02); *H10K 71/00* (2023.02); *H10K 59/1201* (2023.02)

(58) Field of Classification Search
    CPC ............. H10K 59/1201; H10K 59/121; H10K 59/351; G09G 3/3225
    See application file for complete search history.

(56) References Cited

U.S. PATENT DOCUMENTS

| | | | |
|---|---|---|---|
| 2006/0132055 A1 | 6/2006 | Kwak | |
| 2013/0112960 A1* | 5/2013 | Chaji | .................... H10K 50/00 257/40 |
| 2014/0306200 A1* | 10/2014 | Jinta | .................... H10K 59/353 257/40 |
| 2017/0329443 A1 | 11/2017 | Wang et al. | |
| 2018/0233550 A1* | 8/2018 | Han | .................... H10K 59/131 |
| 2019/0155430 A1* | 5/2019 | Hwang | ................. G06F 3/0448 |
| 2019/0319079 A1 | 10/2019 | Xing | |
| 2019/0386086 A1 | 12/2019 | Chen et al. | |
| 2020/0082756 A1 | 3/2020 | Lin et al. | |
| 2021/0193035 A1 | 6/2021 | Li et al. | |
| 2021/0358407 A1 | 11/2021 | Xu et al. | |

FOREIGN PATENT DOCUMENTS

| | | |
|---|---|---|
| CN | 104103667 A | 10/2014 |
| CN | 104871337 A | 8/2015 |
| CN | 105047609 A | 11/2015 |
| CN | 106653817 A | 5/2017 |
| CN | 107799067 A | 3/2018 |
| CN | 108133947 A | 6/2018 |
| CN | 208173203 U | 11/2018 |
| CN | 109036257 A | 12/2018 |
| CN | 109637374 A | 4/2019 |
| CN | 110718575 A | 1/2020 |
| IN | 110060633 A | 7/2019 |
| WO | 2014097264 A1 | 6/2014 |

OTHER PUBLICATIONS

CN 201911008550.7 second office action.
CN 201911008550.7 Notification to grant patent right for invention.

* cited by examiner

TRANSPARENT OLED DISPLAY PANEL, DISPLAY APPARATUS AND MANUFACTURING METHOD

This application is a 371 of International Application No. PCT/CN2020/121945, filed on Oct. 19, 2020, which claims priority to the Chinese Patent Application No. 201911008550.7, filed on Oct. 22, 2019 and entitled "TRANSPARENT OLED DISPLAY PANEL, DISPLAY APPARATUS AND DRIVING METHOD", the entire contents of both of which are incorporated herein by reference.

TECHNICAL FIELD

The present disclosure relates to the field of display technologies, and in particular, relates to a transparent OLED display panel and a manufacturing method therefor, and a display apparatus.

BACKGROUND

A transparent organic light-emitting diode (OLED) display panel refers to a display panel that realizes a display function through an organic light-emitting material and has a transparent effect, and may allow a user to see an image displayed in the transparent OLED display panel and a scene behind the transparent OLED display panel simultaneously.

SUMMARY

Embodiments of the present disclosure provide a transparent OLED display panel, a manufacturing method therefor, and a display apparatus.

In a first aspect, a transparent OLED display panel is provided according to an embodiment of the present invention. The transparent OLED display panel has a plurality of transparent regions and a plurality of display regions, wherein the transparent regions and the display regions are alternately arranged in a first direction;
  the transparent OLED display panel includes a plurality of pixels disposed in the display regions, and a plurality of data lines, the pixels disposed in the same display being arranged in a second direction, and the data lines extending along the first direction which intersects with the second direction;
  each of the pixels includes a plurality of sub-pixels, the sub-pixels disposed in the same display region include a row of first sub-pixels including a plurality of first sub-pixels arranged in the second direction and a row of second sub-pixels including a plurality of second sub-pixels arranged in the second direction, and each pixel at least includes one first sub-pixel and one second sub-pixel adjacent to each other in the first direction; and
  in the same display region, a first sub-pixel and a second sub-pixel adjacent to each other in the first direction are connected to the same data line, and different data lines connected to different first sub-pixels.

Optionally, each of the display regions includes a plurality of sub-pixel groups arranged in the second direction, each of the sub-pixel groups including two sub-pixel pairs adjacent to each other in the second direction, and each sub-pixel pair including one first sub-pixel and one second sub-pixel adjacent to each other in the first direction; and the two data lines connected to the two sub-pixel pairs are disposed between the two sub-pixel pairs in each of the sub-pixel groups.

Optionally, the pixel includes four sub-pixels, and the sub-pixels in each of the sub-pixel groups are from the same pixel.

Optionally, the pixel includes three sub-pixels, and the sub-pixels in each of the sub-pixel groups are from two adjacent pixels.

Optionally, the transparent OLED display panel further includes a plurality of gate lines extending in the second direction, wherein each row of the first sub-pixels and each row of the second sub-pixels are respectively connected to at least one gate line.

Optionally, each of the first sub-pixels in the row of the first sub-pixels is connected to two of the gate lines, and the row of the first sub-pixels is disposed between the two gate lines connected to the first sub-pixels; and each of the second sub-pixels in the row of the second sub-pixels is connected to two of the gate lines, and the row of the second sub-pixels is disposed between the two gate lines connected to the second sub-pixels.

Optionally, the transparent OLED display panel further includes a plurality of power lines extending along the first direction, wherein the first sub-pixels and the second sub-pixels in each of the sub-pixel groups are connected to the same power line.

Optionally, the power line connected to a first sub-pixel group is disposed between the two data lines connected to the first sub-pixel group, the first sub-pixel group being any one of the sub-pixel groups.

Optionally, the transparent OLED display panel further includes a plurality of sensing lines extending along the first direction, wherein the first sub-pixels and the second sub-pixels in each of the sub-pixel groups are connected to the same sensing line.

Optionally, the sensing line connected to a second sub-pixel group is disposed between the two data lines connected to the second sub-pixel group, the second sub-pixel group being any one of the sub-pixel groups.

Optionally, each of the sub-pixels includes a first thin film transistor, a second thin film transistor, a capacitor and an organic light-emitting diode, wherein a gate of the first thin film transistor is electrically connected to the gate line corresponding to the gate, and a source of the first thin film transistor is electrically connected to the data line corresponding to the source, and a drain of the first thin film transistor is electrically connected to a gate of the second thin film transistor and one terminal of the capacitor; a drain of the second thin film transistor is electrically connected to the power line corresponding to the drain, and a source of the second thin film transistor is electrically connected to an anode of the organic light-emitting diode; and the anode of the organic light-emitting diode is electrically connected to the other terminal of the capacitor.

Optionally, each of the sub-pixels further includes a third thin film transistor, gates of the third thin film transistors of the sub-pixels in the same row are connected to the same gate line, and for any row of the sub-pixels, the gate lines connected to the third thin film transistor and the first thin film transistor are different; and a drain of the third thin film transistor is electrically connected to the other terminal of the capacitor and the source of the second thin film transistor, and a source of the third thin film transistor is electrically connected to the sensing line corresponding to the third thin film transistor.

Optionally, each of the sub-pixels includes an active layer, a gate insulating layer, a first electrode layer, an interlayer insulating layer, a second electrode layer, a passivation layer and a metal anode layer which are sequentially laminated on a base substrate, the metal anode layer and the second electrode layer being connected through a via hole, and the first electrode layer being isolated from the active layer through the gate insulating layer.

Optionally, the source of the second thin film transistor is disposed in the active layer, and the drain of the third thin film transistor is disposed in the active layer.

Optionally, each of the sub-pixels further includes at least one of a planarizing layer and a buffer layer, the planarizing layer being disposed between the passivation layer and the metal anode layer, and the buffer layer being disposed between the base substrate and the active layer.

Optionally, the display panel in the transparent region includes a base substrate, a gate insulating layer, an interlayer insulating layer and a passivation layer which are sequentially laminated.

In a second aspect, a display apparatus is provided according to an embodiment of the present disclosure. The display apparatus includes the transparent OLED display panel according to the first aspect.

In a third aspect, a method for manufacturing a transparent OLED display panel is provided according to an embodiment of the present disclosure. The method includes:

forming a plurality of pixels and a plurality of data lines on a base substrate to obtain a transparent OLED display panel having a plurality of transparent regions and a plurality of display regions, the display regions and the transparent regions being alternately arranged in a first direction, wherein the pixels are disposed in the display regions, pixels in the same display region are arranged in a second direction, and the data lines extend along the first direction which intersects with the second direction;

each of the pixels includes a plurality of sub-pixels, the sub-pixels disposed in the same display region include a row of first sub-pixels including a plurality of first sub-pixels arranged in the second direction and a row of second sub-pixels including a plurality of second sub-pixels arranged in the second direction, and the pixel at least includes one first sub-pixel and one second sub-pixel adjacent to each other in the first direction; and the first sub-pixel and the second sub-pixel adjacent to each other in the first direction in the same display region are connected to the same data line, and different data lines connected to different first sub-pixels.

DETAILED DESCRIPTION

For clearer descriptions of the principles, technical solutions, and advantages of the present disclosure, the embodiments of the present disclosure are described in detail hereinafter with reference to the accompanying drawings.

Figure 1:
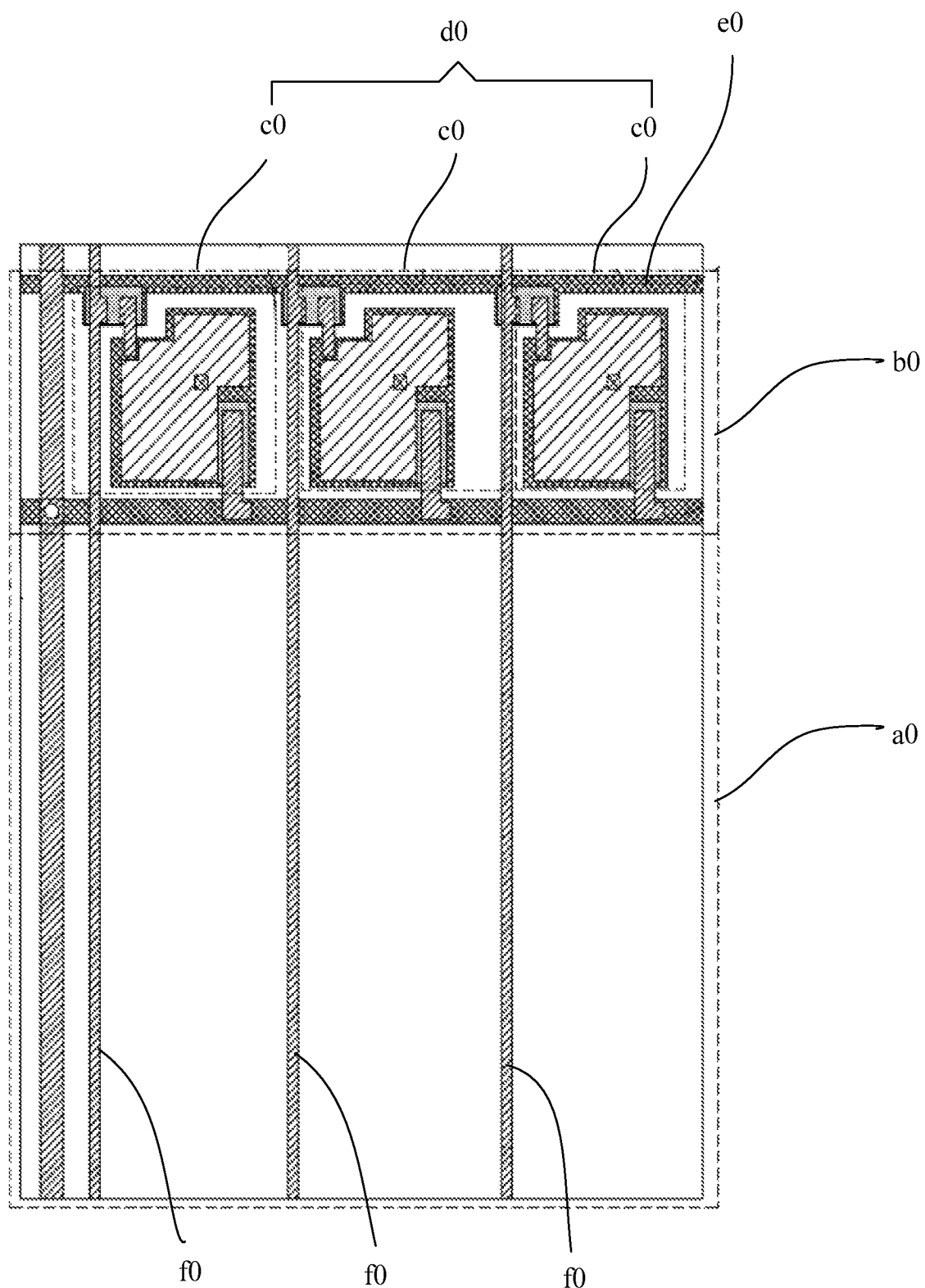
FIG. 1 is a schematic structure diagram of a transparent OLED display panel in the related art.

FIG. 1 is a schematic structure diagram of a transparent OLED display panel in the related art. As shown in FIG. 1, the transparent OLED display panel in the related art includes a plurality of transparent regions a0 and a plurality of display regions b0 alternately arranged with the transparent regions a0 in a first direction, and one transparent region a0 and one display region b0 adjacent to each other constitute one repetition period. For convenience of description, only one repetition period is shown in FIG. 1. Actually, the transparent region a0 and the display region b0 may have a plurality of repetition periods.

The transparent OLED display panel includes a plurality of sub-pixels c0 arranged in an array, each row of the sub-pixels c0 is disposed in one display region b0, and a plurality of consecutive sub-pixels c0 of different colors in each row constitute a pixel d0.

Each row of sub-pixels c0 is electrically connected to a gate line e0, and each column of sub-pixels c0 is electrically connected to a data line f0. Each sub-pixel c0 acquires a scanning signal through the gate line e0 electrically connected to the sub-pixel c0, and acquires a data signal through the data line f0 electrically connected to the sub-pixel c0. An OLED in each sub-pixel c0 is driven to emit light under the action of the scanning signal and the data signal, thereby displaying an image in the display region b0 of the transparent OLED display panel. Moreover, a scene behind the transparent OLED display panel can be seen through the transparent regions a0.

As shown in FIG. 1, the data lines f0 extend along the first direction, pass through the transparent regions a0 and the display regions b0, and need to be shielded by black matrixes (not shown in the figure). The data line f0 and the black matrix disposed in the transparent region a0 reduce a light-emitting area of the transparent region a0. Meanwhile, each data line f0 occupies a certain area of the display region b0, such that arrangement space of the sub-pixels c0 in the display region b0 is reduced, resulting in lower resolution.

Figure 2:
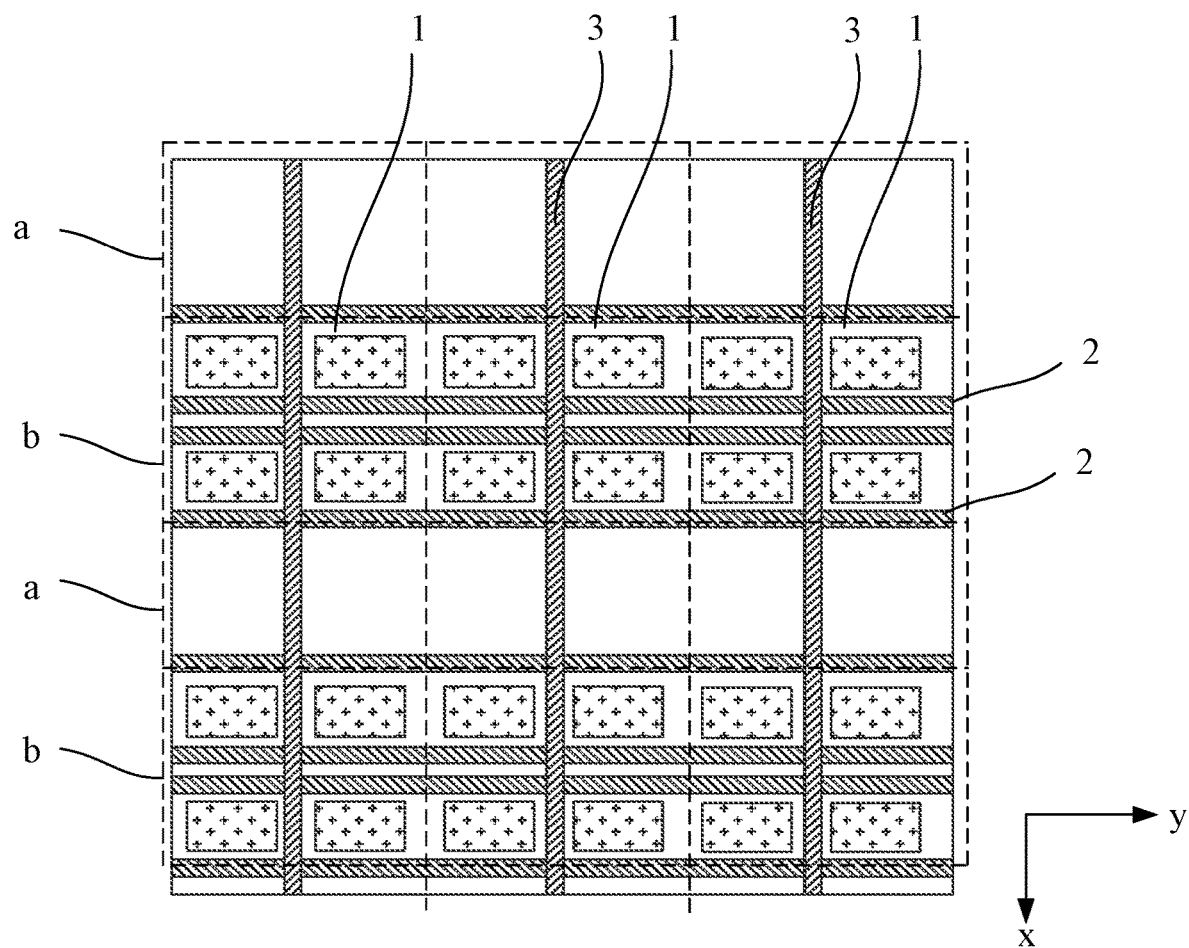
FIG. 2 is a schematic structure diagram of a transparent OLED display panel according to an embodiment of the present disclosure.

FIG. 2 is a schematic structure diagram of a transparent OLED display panel according to an embodiment of the present disclosure. As shown in FIG. 2, the transparent OLED display panel has a plurality of transparent regions a and a plurality of display regions b, wherein the transparent regions and the display regions are alternately arranged a in a first direction. A user can see a scene behind the transparent OLED display panel through the transparent regions a, and at the same time, can see an image displayed by the transparent OLED display panel in the display regions b.

The transparent OLED display panel includes a plurality of pixels 1 disposed in the display regions b. The pixels 1 in the same display region b are arranged in a second direction which intersects with the first direction, for example, the first direction and the second direction being perpendicular to each other. In an exemplary embodiment, the first direction is the direction indicated by arrow x in FIG. 2, and the second direction is the direction indicated by arrow y in FIG. 2.

In the embodiments of the present disclosure, the first direction serves as the column direction and the second direction serves as the row direction for description.

As shown in FIG. 2, the transparent OLED display panel further includes a plurality of gate lines 2 and a plurality of data lines 3. The gate lines 2 are parallel to each other and extend in the second direction. The data lines 3 are parallel to each other and extend along the first direction.

Figure 3:
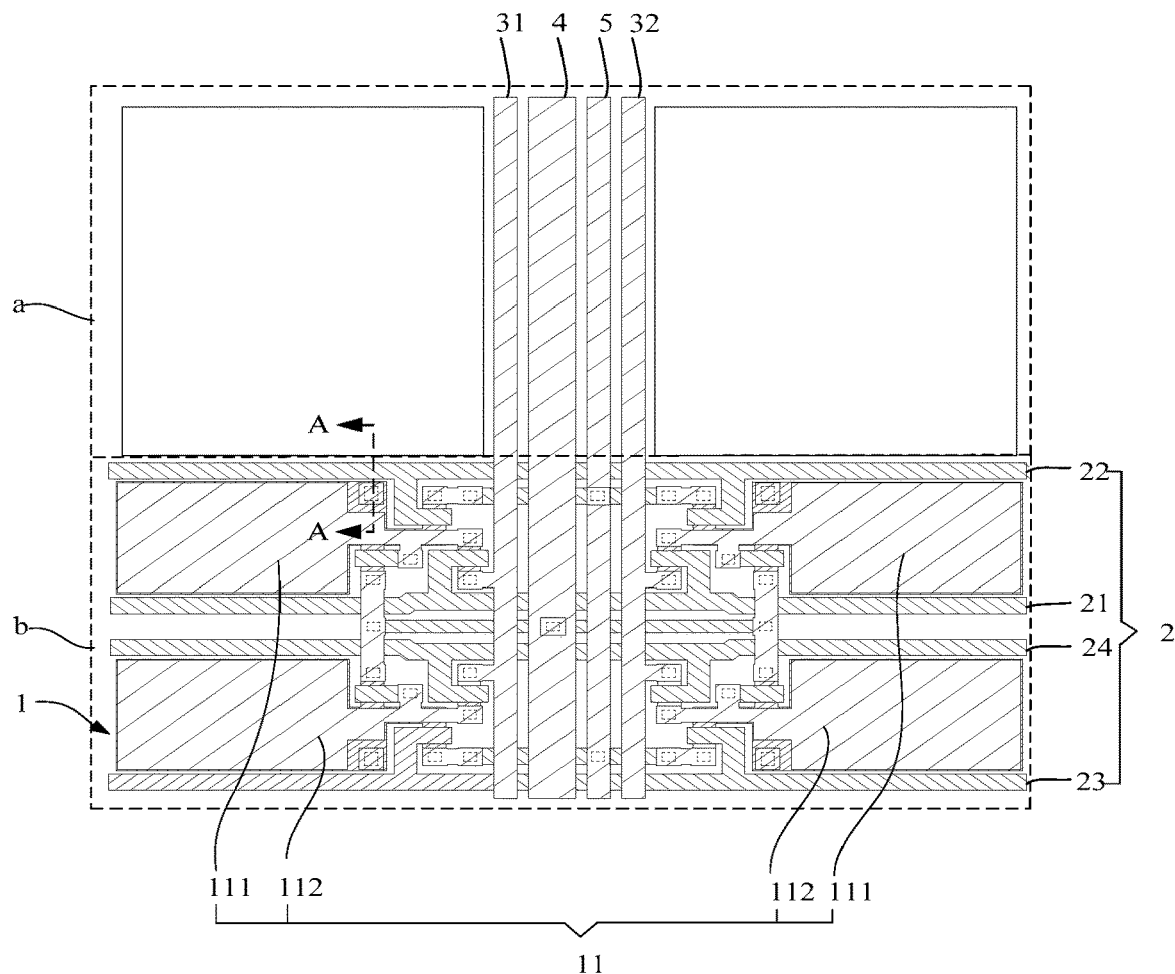
FIG. 3 is a schematic diagram of a partially enlarged structure of a transparent OLED display panel according to an embodiment of the present disclosure.

FIG. 3 is a schematic diagram of a partially enlarged structure of a transparent OLED display panel according to an embodiment of the present disclosure. As shown in FIG. 3, each pixel 1 includes a plurality of sub-pixels 11, and the sub-pixels 11 in each display region b are divided into two rows of sub-pixels 11 both arranged in the second direction. In the two rows of the sub-pixels 11, one row of the sub-pixels 11 is first sub-pixels 111, and the other row of sub-pixels 11 is second sub-pixels 112. Each pixel 1 includes at least one first sub-pixel 111 and at least one second sub-pixel 112. That is, the sub-pixels 11 included in each pixel 1 are divided into two rows; and among the first sub-pixels 111 and the second sub-pixels 112 included in each pixel 1, at least one first sub-pixel 111 and at least one second sub-pixel 112 are adjacent to each other in the first direction.

In the same display region b, the first sub-pixel 111 and the second sub-pixel 112 adjacent to each other in the first direction are connected to the same data line 3, and data lines 3 connected to different first sub-pixels 111 are different. That is, the sub-pixels 11 in the same column are connected to one data line 3, and the sub-pixels 11 in different columns are connected to the different data lines 3. For example, in FIG. 3, the first sub-pixel 111 and the second sub-pixel 112 on the left are connected to a data line 31, and the first sub-pixel 111 and the second sub-pixel 112 on the right are connected to a data line 32.

In the embodiment of the present disclosure, by dividing the sub-pixels of one pixel into two rows, the number of columns of the sub-pixels corresponding to one pixel is reduced. Since the sub-pixels in the same column share one data line, in case that the number of the sub-pixel columns is reduced, the number of the data lines used by each pixel is less than the number of the sub-pixels included in the pixel. Compared with the number of data lines used for each pixel and the number of sub-pixels included in the pixel in the related art, the number of the data lines is reduced. On the one hand, since the data lines pass through the transparent regions and occupy the area of the transparent regions, the area of the transparent regions can be increased along with the decrease of the number of the data lines, thereby increasing an area ratio of the transparent regions in the transparent OLED display panel. On the other hand, the area of the display regions occupied by the data lines is reduced as the decrease of the number of the data lines, such that more sub-pixels can be arranged in the display regions of the same area, thereby improving the resolution of the transparent OLED display panel.

Optionally, in the embodiment of the present disclosure, each row of the first sub-pixels 111 and each row of the second sub-pixels 112 are respectively connected to at least one gate line 2, and the gate lines 2 connected to the first sub-pixels 111 and the second sub-pixels 112 are different. For example, one row of first sub-pixels 111 is connected to one gate line 2, and one row of second sub-pixels 112 is connected to another gate line 2.

In an exemplary embodiment, each row of the sub-pixels corresponds to two gate lines, and each sub-pixel in each row of the sub-pixels is connected to the corresponding two gate lines. For example, each of the first sub-pixels 111 in one row of the first sub-pixels 111 is connected to two gate lines 2 (namely, a first gate line 21 and a second gate line 22), and the row of the first sub-pixels 111 is disposed between the two connected gate lines 2. Each of the second sub-pixels 112 in one row of the second sub-pixels 112 is connected to other two gate lines 2, and the row of the second sub-pixels 112 is disposed between the two connected gate lines 2 (namely, a third grid line 23 and a fourth grid line 24).

It should be noted that FIG. 3 only shows one pixel 1 in each display region b, and the structure of the transparent region a adjacent to the display region b to which the pixel 1 belongs in the first direction. The structure shown in FIG. 3 is a repeating unit of the transparent OLED display panel according to the embodiment of the disclosure. That is, the transparent OLED display panel includes a plurality of structures shown in FIG. 3 in the second direction, and further includes a plurality of structures shown in FIG. 3 in the first direction. Thus, the embodiment of the present disclosure is exemplified by the partial structure of the transparent OLED display panel shown in FIG. 3.

In addition, it should be noted that in the embodiment shown in FIG. 3, each display region b includes one row of pixels 1. In other embodiments, each display region may include multiple rows of pixels 1 (for example, including two rows of pixels 1), and the sub-pixels 11 in each row of the pixels 1 are divided into two rows.

As shown in FIG. 3, the pixel 1 includes four sub-pixels 11 arranged in a square form, and the four sub-pixels 11 include two first sub-pixels 111 and two second sub-pixels 112 arranged in the second direction. The first first sub-pixel 111 in the first row and the first second sub-pixel 112 in the second row are adjacent to each other and are connected to the same first data line 31. The second first sub-pixel 111 in the first row and the second second sub-pixel 112 in the second row are adjacent to each other and are connected to the second data line 32. It can be seen that the pixel 1 is connected to the two data lines 3. Since the transparent regions a is alternately arranged with the display regions b in the first direction, each column of the pixels 1 is connected to two data lines 3 in the first direction.

In the related art, referring to FIG. 1 again, the sub-pixel c0 of each of different colors in one pixel d0 is connected to one data line f0. If one pixel d0 includes four sub-pixels c0, it needs to be connected to four data lines f0. Since the multiple pixels in one column of the pixels are connected to the same data line, each column of the pixels needs to be connected to four data lines in the related art.

In case that the numbers of the pixels are the same and the areas of the sub-pixels are the same, compared with the related art, the number of the data lines is reduced according to the embodiment of the present disclosure reduces. Since the data lines pass through the transparent regions in the first direction, an occupied area of the transparent regions is reduced as the decrease of the number of the data lines. Thus, an area ratio of the transparent regions is increased. Meanwhile, since the data lines pass through the display regions, an occupied area of the display regions is reduced as the decrease of the number of the data lines. Thus, more sub-pixels can be arranged on the display panel, thereby improving the resolution of the display panel.

Optionally, referring to FIGS. 2 and 3 again, each display region b includes a plurality of sub-pixel groups arranged in the second direction. Each dashed box in FIG. 2 represents one sub-pixel group, and FIG. 3 shows the structure of the sub-pixel group. Each of the sub-pixel groups includes two adjacent sub-pixel pairs in the second direction y, and each sub-pixel pair includes one first sub-pixel 111 and one second sub-pixel 112 adjacent to each other in the first direction x. That is, each sub-pixel group includes two adjacent first sub-pixels 111 in the second direction y and two adjacent second sub-pixels 112 in the second direction y. Two data lines 3 connected to the two sub-pixel pairs in each sub-pixel group are disposed between the two sub-pixel pairs, namely, between the two adjacent first sub-pixels 111 and the two adjacent second sub-pixels 112.

In each display region b, the two data lines 3 connected to the two sub-pixel pairs in each sub-pixel group are arranged between the two sub-pixel pairs in the second direction, such that no data line exists between the two adjacent sub-pixel groups. Compared with an arrangement in which one data line 3 passing through the transparent region a and the display region b is arranged between every two adjacent columns of sub-pixels 11, in the embodiment of the present disclosure, no data line passes through the transparent region a corresponding to the two adjacent sub-pixel groups, such that the area of the whole transparent region a is increased, which is convenient for a user to watch a scene behind the transparent OLED display panel through the transparent regions a.

Figure 4:
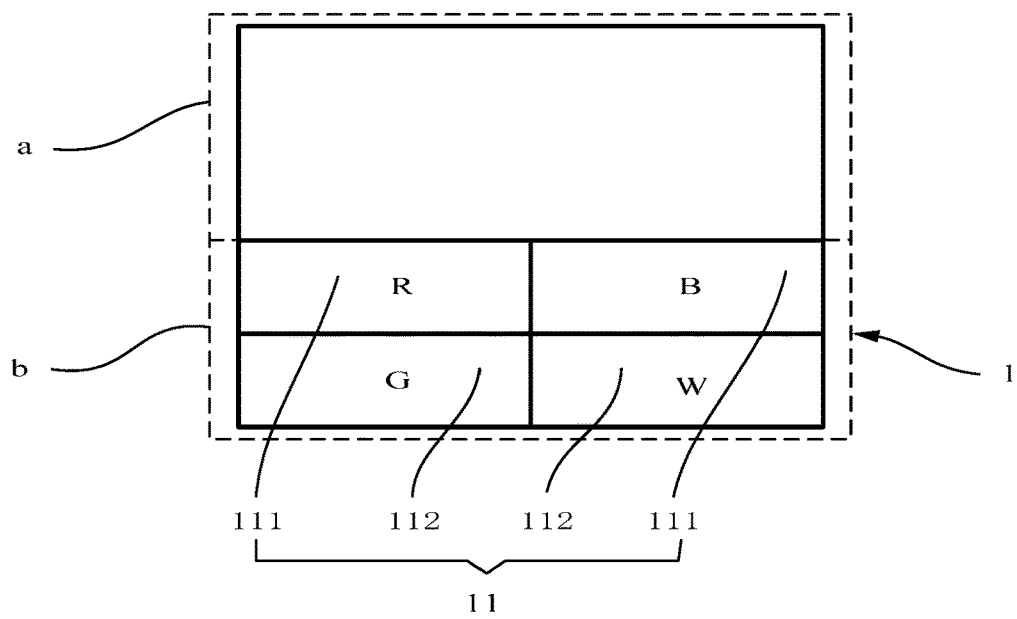
FIG. 4 is a schematic arrangement diagram of pixels of a transparent OLED display panel according to an embodiment of the present disclosure.

FIG. 4 is a schematic arrangement diagram of pixels of a transparent OLED display panel according to an embodiment of the present disclosure. FIG. 4 shows a unit composed of one pixel 1 in a display region b and a transparent region a adjacent thereto in the transparent OLED display panel, and the unit corresponds to the sub-pixel 11 and the transparent region a in FIG. 3.

In the embodiment shown in FIGS. 3 and 4, each pixel 1 includes four sub-pixels 11, and the four sub-pixels 11 in each pixel 1 correspond to one sub-pixel group in FIG. 3. That is, the four sub-pixels 11 in each sub-pixel group belong to the same pixel 1. In an exemplary embodiment, as shown in FIG. 4, the four sub-pixels 11 are a red (R) sub-pixel, blue sub-pixel, green (G) sub-pixel, and white (W) sub-pixel, respectively. In an exemplary embodiment, the two first sub-pixels 111 are red and blue sub-pixels, respectively, and the two second sub-pixels 112 are green and white sub-pixels, respectively.

Figure 5:
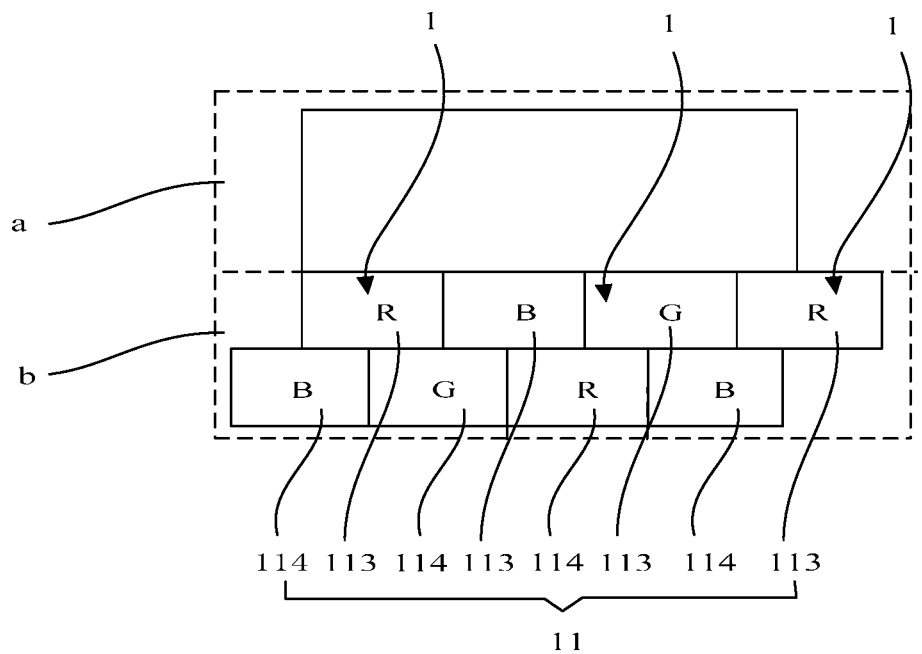
FIG. 5 is a schematic arrangement diagram of pixels of another OLED display panel according to an embodiment of the present disclosure.

FIG. 5 is a schematic arrangement diagram of pixels of another OLED display panel according to an embodiment of the present disclosure. As shown in FIG. 5, each pixel 1 includes three sub-pixels 11 arranged in a fashion of Chinese character "pin" (like a triangle). In this case, the four sub-pixels in each group of the sub-pixels 11 may include three sub-pixels in one pixel 1 and one sub-pixel 11 in another pixel 1. That is, the four sub-pixels 11 in the sub-pixel group are from two adjacent pixels 1.

In an exemplary embodiment, the three sub-pixels 11 in one pixel 1 are the blue sub-pixel, red sub-pixel, and green sub-pixel, respectively. Referring to the connection mode of the sub-pixels 11 and the data lines 3 in the OLED display panel shown in FIG. 3, it can be seen that in the embodiment shown in FIG. 5, in one display region b, the red first sub-pixel 113 in the first row of the sub-pixels 11 and the blue second sub-pixel 114 in the second row of the sub-pixels share the first data line 31; and the green second sub-pixel 114 in the second row of the sub-pixels 11 and the blue first sub-pixel 113 in the first row of the sub-pixels share the second data line 32. That is, every two thirds of the pixel is controlled through one data line. However, as shown in FIG. 1, the pixel d0 in one display region b0 in the related art includes three sub-pixels c0 arranged in sequence, each of which is controlled through one corresponding data line f0. That is, every third of the pixel is controlled by one data line. In summary, in case that the numbers of the pixels are the same, and the numbers and the structures of the sub-pixels are also the same, the number of the data lines according to the embodiment shown in FIG. 5 is still less than the number of the data lines in the related art, such that the area ratio of the transparent regions a in the display panel is increased, and more sub-pixels can be arranged in the display regions b, thereby improving the resolution of the display panel.

In an exemplary embodiment, as shown in FIG. 5, the pixel 1 includes a red first sub-pixel 113, a blue second sub-pixel 114 and a green second sub-pixel 114, or the pixel 1 includes a blue first sub-pixel 113, a green first sub-pixel 113 and a red second sub-pixel 114.

Optionally, referring to FIG. 3 again, the transparent OLED display panel further includes a plurality of power lines 4. Referring to FIG. 3, the power lines 4 extend along the first direction and pass through the transparent regions a and the display regions b. The first sub-pixels 111 and the second sub-pixels 112 in each group of the sub-pixels 11 are connected to the same power line 4. The power line 4 is configured to provide power to an OLED in the transparent OLED display panel. Each group of the sub-pixels 11 includes two adjacent first sub-pixels 111 and two adjacent second sub-pixels 112. That is, the four sub-pixels 11 share one power line 4. That is, in each display region b, every two columns of the sub-pixels 11 in each pixel 1 are connected to the same power line 4. However, usually in the related art, each column of the sub-pixels 11 is connected to one power line 4. Therefore, compared with the related art, the number of the power lines 4 according to the embodiment of the present disclosure is reduced, such that the area ratio of the transparent regions a in the display panel can be increased. In addition, an area of the display regions b occupied by the power lines 4 is reduced as the decrease of the number of the power lines 4. Thus, more sub-pixels 11 can be arranged in the display regions b, thereby improving the resolution of the display panel.

Optionally, the power line 4 is disposed between two data lines 3 connected to a group of sub-pixels 11. In each group of the sub-pixels 11, the power line 4 and the two data lines 3 are disposed in a gap between the two columns of the sub-pixels 11. Since the number of the data lines 3 is greater than that of the power lines 4, the two columns of sub-pixels 11 are proximal to the two corresponding data lines 3 by arranging the power line 4 between the two data lines 3. Thus, no jumper wire across the power line 4 is required to connect the data lines 3 with the corresponding sub-pixels 11, thereby facilitating wiring and improving the production efficiency.

Optionally, referring to FIG. 3 again, the transparent OLED display panel further includes a plurality of sensing lines 5 extending along the first direction, and the first sub-pixels 111 and the second sub-pixels 112 in each sub-pixel group are connected to the same sensing line 5. The sensing line 5 is configured to sense electrical signals in the sub-pixels 11 connected to the sensing line 5 and transmit a compensation voltage signal of an external compensation circuit. Each sub-pixel group includes two adjacent first sub-pixels 111 and two adjacent second sub-pixels 112. That is, the four sub-pixels 11 share one sensing line 5. It can also be considered that in each display region b, two adjacent columns of the sub-pixels 11 are connected to the same sensing line 5. Since a compensation voltage in any sub-pixel 11 may be calculated independently by adjusting voltages of level signals of the first data line 31 and the second data line 32, it only needs to connect one sensing line 5 with all the sub-pixels in each group of the sub-pixels 11, and there is no need to arrange multiple sensing lines 5. On the one hand, the number of the sensing lines 5 passing through the transparent regions a is reduced, such that the area ratio of the transparent regions a in the display panel can be increased. On the other hand, an area of the display regions b occupied by the sensing lines 5 is reduced, such that more sub-pixels 11 can be arranged in the display regions b, thereby improving the resolution.

Optionally, the sensing line 5 is disposed between the first data line 31 and the second data line 32 connected to the sub-pixel group corresponding to the sensing line 5. The sensing line 5, the first data line 31 and the second data line 32 are disposed between the two columns of sub-pixels 11. Since the number of the data lines 3 is greater than that of the sensing lines 5, the two columns of sub-pixels 11 are proximal to the corresponding first data line 31 and second data line 32 by arranging the sensing line 5 between the first data line 31 and the second data line 32. Thus, no jumper wire across the sensing line 5 is required to connect the data lines 3 with the corresponding sub-pixels 11, thereby facilitating wiring and improving the production efficiency.

In the OLED display panel, the sub-pixel 11 includes a pixel circuit and a light-emitting element. The pixel circuit is disposed between a base substrate and the light-emitting element. The light-emitting element is an OLED, and includes a first electrode, an organic light-emitting layer and a second electrode which are laminated in sequence. The second electrode is disposed on one side of the organic light-emitting layer facing the base substrate. Here, the second electrode is an anode, and the first electrode is a cathode. The pixel circuit includes at least two thin film transistors. Taking a top-gate thin film transistor as an example, the thin film transistor includes an active layer disposed on the base substrate, a gate layer disposed on one side of the active layer distal from the base substrate, a source and drain layer disposed on one side of the gate layer distal from the base substrate, and the like. In the following description, the top-gate thin film transistor is used as an example. In other embodiments, the thin film transistor may be a bottom-gate thin film transistor or a double-gate thin film transistor, which is not limited in the present disclosure.

In an exemplary embodiment, the pixel circuit includes a 2T1C circuit, a 3T1C circuit, a 7T1C circuit, or the like. The 2T1C circuit can usually only achieve a relatively simple light emitting and control function. The 3T1C circuit can not only realize the light emitting and control function, but also compensate the thin film transistor in the pixel circuit through external compensation technology to improve display quality. The 7T1C circuit used in the transparent OLED display causes an undersized transparent region due to a complex structure of the 7T1C circuit, resulting in lower resolution. In the embodiment of the present disclosure, the 3T1C circuit is selected as the pixel circuit in the transparent OLED. Here, T represents a transistor and C represents a capacitor.

The 3T1C circuit as the pixel circuit is taken as an example hereinafter to explain the structure of the sub-pixel.

Figure 6:
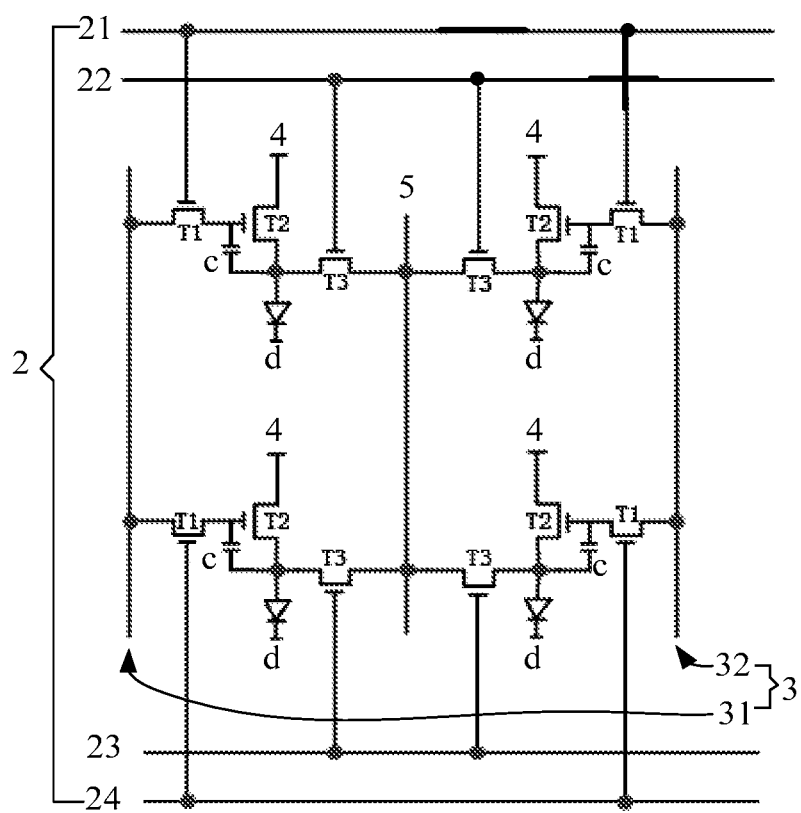
FIG. 6 is a schematic structure diagram of a circuit of a sub-pixel group of a transparent OLED display panel according to an embodiment of the present disclosure.
Figure 7:
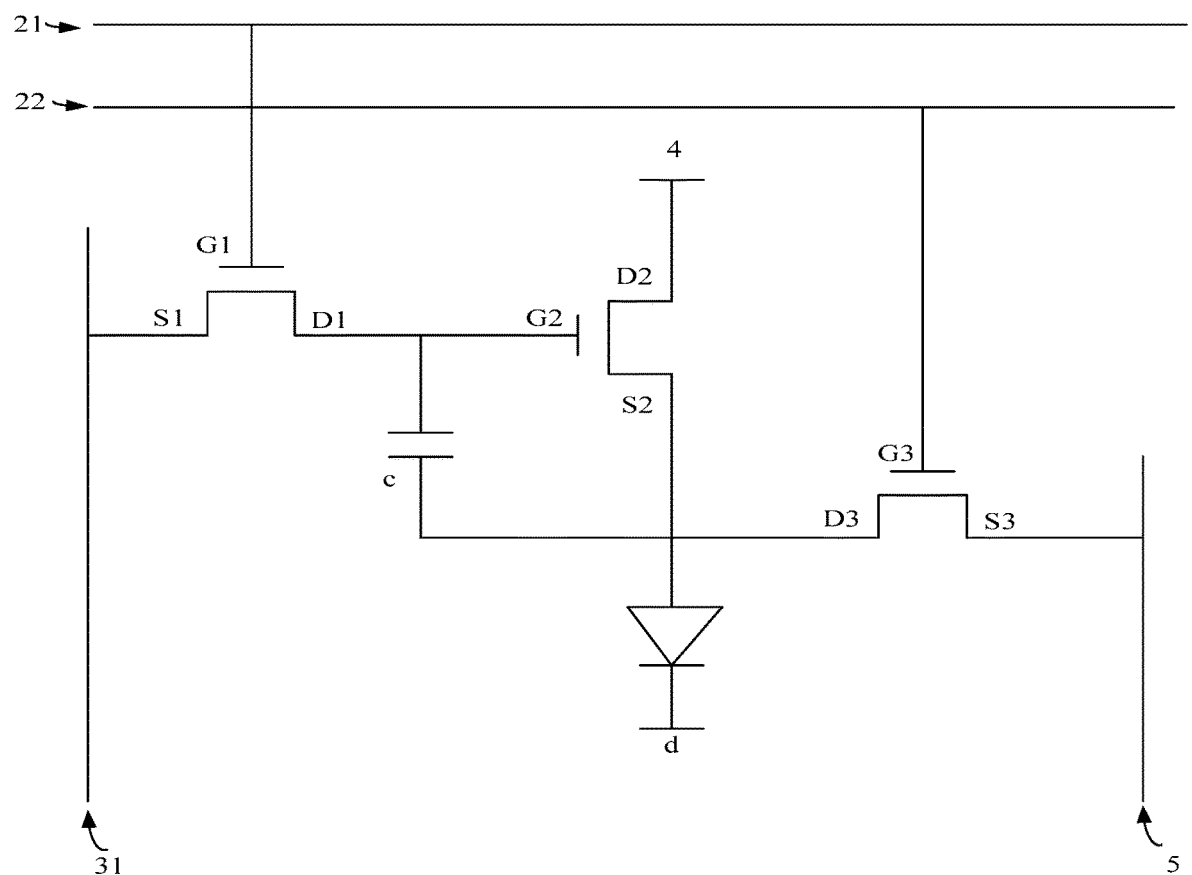
FIG. 7 is a schematic structure diagram of a circuit of a sub-pixel of a transparent OLED display panel according to an embodiment of the present disclosure.
Figure 8:
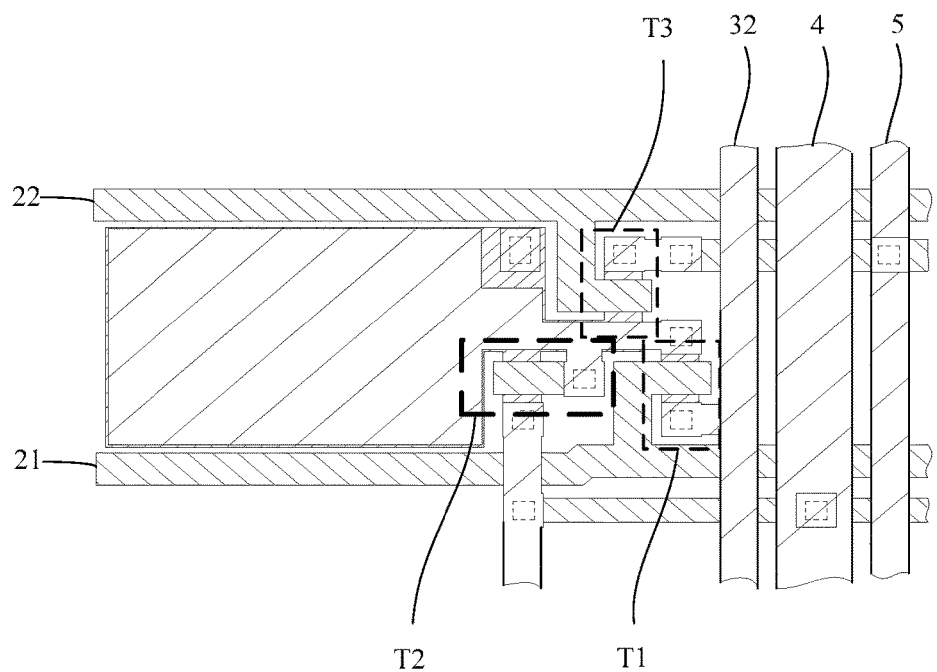
FIG. 8 is a schematic diagram of a partially enlarged structure of a sub-pixel of a transparent OLED display panel according to an embodiment of the present disclosure.

FIG. 6 is a schematic structure diagram of a circuit of a sub-pixel group of a transparent OLED display panel according to an embodiment of the present disclosure. FIG. 7 is a schematic structure diagram of a circuit of a sub-pixel of a transparent OLED display panel according to an embodiment of the present disclosure. FIG. 8 is a schematic diagram of a partially enlarged structure of a sub-pixel of a transparent OLED display panel according to an embodiment of the present disclosure. As shown in FIGS. 6, 7 and 8, each sub-pixel 11 includes a first thin film transistor T1, a second thin film transistor T2, a capacitor c, and an organic light-emitting diode d. A gate G1 of the first thin film transistor T1 is connected to a first gate line 21, a source S1 of the first thin film transistor T1 is connected to a first data line 31 corresponding to the sub-pixel 11, and a drain D1 of the first thin film transistor T1 is connected to a gate G2 of the second thin film transistor T2 and one terminal of the capacitor c. A drain D2 of the second thin film transistor T2 is connected to the power line 4, and a source S2 of the second thin film transistor T2 is connected to an anode of the OLED d and the other terminal of the capacitor c.

FIG. 7 is a schematic structure diagram of a circuit of the sub-pixel at the upper left corner of FIG. 3. In the circuit shown in FIG. 7, the gate G1 of the first thin film transistor T1 acquires a scanning signal from the first gate line 21, the source S1 of the first thin film transistor T1 acquires a data signal from the first data line 31, the gate G2 of the second thin film transistor T2 receives the data signal output from the drain D1 of the first thin film transistor T1, and the drain D2 of the second thin film transistor T2 acquires a power signal from the power line 4 to drive the OLED d connected to the source S2 of the second thin film transistor T2 to emit light.

It should be noted that driving modes of the other sub-pixels 11 in each pixel 1 are consistent with the driving mode of this sub-pixel.

Optionally, each sub-pixel 11 further includes a third thin film transistor T3. A gate G3 of the third thin film transistor T3 is electrically connected to the gate line 2 connected to another third thin film transistor T3 of the sub-pixel 11 adjacent to the third thin film transistor T3 in the second direction. In addition, the third thin film transistor T3 and the first thin film transistor T1 in the same sub-pixel 11 are connected to different gate lines 2. That is, the gates G3 of the third thin film transistors T3 of one row of sub-pixels 11 are connected to the same gate line 2 which is different from the gate line connected to the gates G1 of the first thin film transistors T1 of the row of the sub-pixels 11. For example, the first thin film transistor T1 of the first sub-pixel 111 in the first row and the first thin film transistor T1 of the second sub-pixel 111 in the first row are connected to the first gate line 11, and the third thin film transistor T3 of the first sub-pixel 111 in the first row and the third thin film transistor T3 of the second sub-pixel 111 in the first row are connected to the second gate line 22; and the first thin film transistor T1 of the first sub-pixel 112 in the second row and the first thin film transistor T1 of the second sub-pixel 112 in the second row are connected to the fourth gate line 24, and the third thin film transistor T3 of the first sub-pixel 112 in the second row and the third thin film transistor T3 of the second sub-pixel 111 in the second row are connected to the third gate line 23. The drain D3 of the third thin film transistor T3 is connected to the other terminal of the capacitor c and the source S2 of the second thin film transistor T2, and the source S3 of the third thin film transistor T3 is connected to the sensing line 5.

It should be noted that when the transparent OLED display panel works, a voltage difference between the anode and the cathode of the OLED should keep a theoretical voltage difference. However, during the use of the OLED, the power voltage drops due to factors such as process conditions, external environment and service time, such that a difference exists between a difference between voltages actually applied to the two terminals of the OLED and the theoretical voltage difference, adversely affecting the display effect of the transparent OLED display panel. The compensation voltage of the voltage difference may be calculated by providing an external compensation circuit driven by the third thin film transistor T3.

Taking the driving circuit of the sub-pixel at the upper left corner of FIG. 5 as an example again, in the sensing phase, the first gate line 21 and the second gate line 22 simultaneously control the first thin film transistor T1 and the third thin film transistor T3 to be turned on. The first data line 31 and the second data line 32 provide the first sub-pixel 111 with a low-level signal (the low-level signal is lower than a turn-on voltage of the second thin film transistor T2 of the first sub-pixel 111, and for example, may be 2V), such that the first sub-pixel 111 charges the sensing line 5, and thus, the compensation voltage of the first sub-pixel 111 can be calculated. In the first sub-pixel 111 adjacent to this sub-pixel in the second direction, although both the first thin film transistor T1 and the third thin film transistor T3 are turned on, the source of the first thin film transistor T1 acquires a low-level signal having a voltage usually being 0V or negative through the second data line 32. Thus, the influence on the sensing line 5 is negligible, and the compensation voltage of the first sub-pixel 111 at the upper left corner can be calculated independently.

Figure 9:
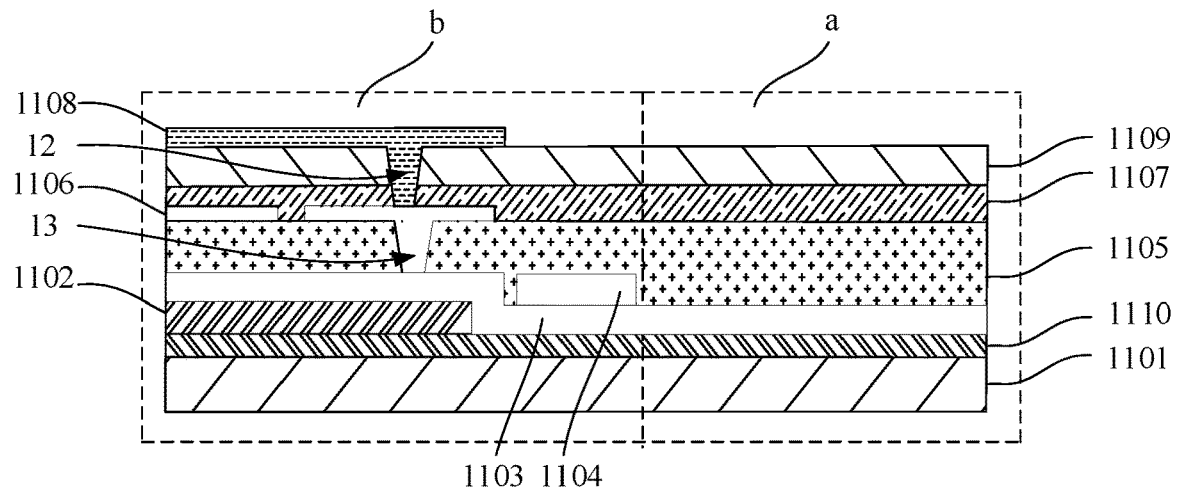
FIG. 9 is a schematic sectional view along line A-A in FIG. 3.

FIG. 9 is a schematic sectional view along line A-A in FIG. 3. As shown in FIG. 9, each sub-pixel 11 includes an active layer 1102, a gate insulating layer 1103, a first electrode layer 1104, an interlayer insulating layer 1105, a second electrode layer 1106, a passivation layer 1107 and a metal anode layer 1108 which are sequentially laminated on a base substrate 1101. The metal anode layer 1108 and the second electrode layer 1106 are connected through a via hole 12, the second electrode layer 1106 and the active layer 1102 are connected through a via hole 13, and the first electrode layer 1104 is isolated from the active layer 1102 through the gate insulating layer 1103.

It should be noted that in the present embodiment, the metal anode layer 1108 and the active layer 1102 are connected through the via hole 12, the second electrode layer 1106 and the via hole 13. In other embodiments, the metal anode layer 1108 and the active layer 1102 may also be directly connected through one via hole. In addition, the display panel according to the embodiments of the present disclosure may further include a pixel definition layer, a light-emitting layer, and a cathode layer, and the structure of these layers may refer to the related art, and detailed descriptions are omitted herein.

Figure 10:
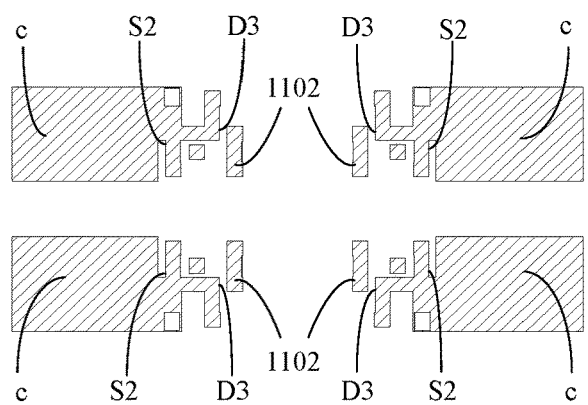
FIG. 10 is a schematic structure diagram of an active layer according to an embodiment of the present disclosure.

FIG. 10 is a schematic structure diagram of an active layer according to an embodiment of the present disclosure. As shown in FIG. 10, the source S2 of the second thin film transistor T2 is disposed on the active layer 1102, and the drain D3 of the third thin film transistor T3 is disposed on the active layer 1102. Part of the active layer 1102 is metalized to form a conductor as one electrode plate of the capacitor c, the source S2 of the second thin film transistor T2 and the drain D3 of the third thin film transistor T3.

Figure 11:
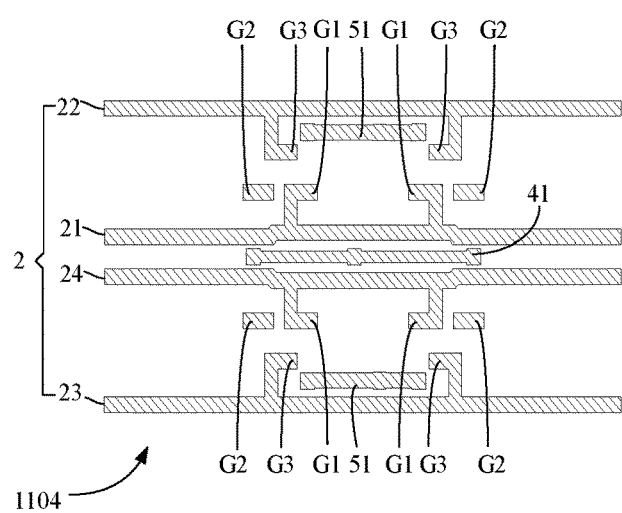
FIG. 11 is a schematic structure diagram of a first electrode layer according to an embodiment of the present disclosure.
Figure 12:
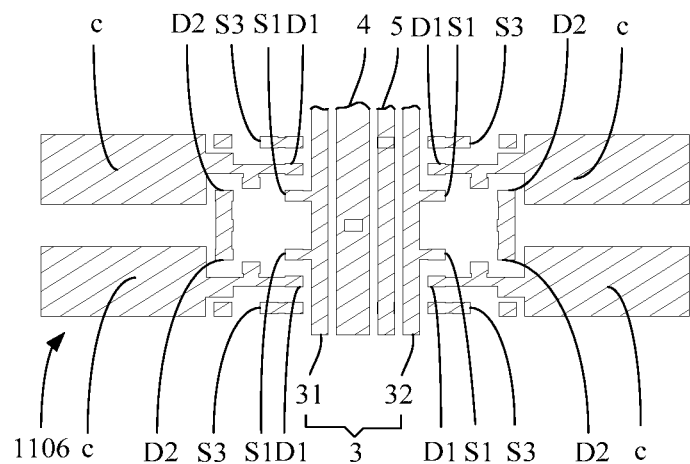
FIG. 12 is a schematic structure diagram of a second electrode layer according to an embodiment of the present disclosure.

FIG. 11 is a schematic structure diagram of a first electrode layer according to an embodiment of the present disclosure. As shown in FIG. 12, in an exemplary embodiment, the first electrode layer 1104 may be a gate layer, and may include a plurality of gate lines 2 (such as a first gate line 21, a second gate line 22, a third gate line 23 and a fourth gate line 24) and gates of thin film transistors in each sub-pixel (such as a gate G1 of the first thin film transistor T1, a gate G2 of the second thin film transistor T2, and a gate G3 of the third thin film transistor T3).

Optionally, as shown in FIG. 11, the first electrode layer 1104 may further include a connecting line 41 connecting the drain D2 of the second thin film transistor T2 and the power line 4, and a connecting line 51 connecting the source S3 of the third thin film transistor T3 and the sensing line 5.

FIG. 12 is a schematic structure diagram of a second electrode layer according to an embodiment of the present disclosure. As shown in FIG. 12, in an exemplary embodiment, the second electrode layer 1106 is a source and drain layer, and the second electrode layer 1106 includes a plurality of data lines 3 (for example, a first data line 31 and a second data line 32), a power line 4, a sensing line 5, an electrode plate of the capacitor c, and at least one of the source and the drain of each thin film transistor, such as the source S1 and the drain D1 of the first thin film transistor T1, the drain D2 of the second thin film transistor T2, and the source S3 of the third thin film transistor T3.

Figure 13:
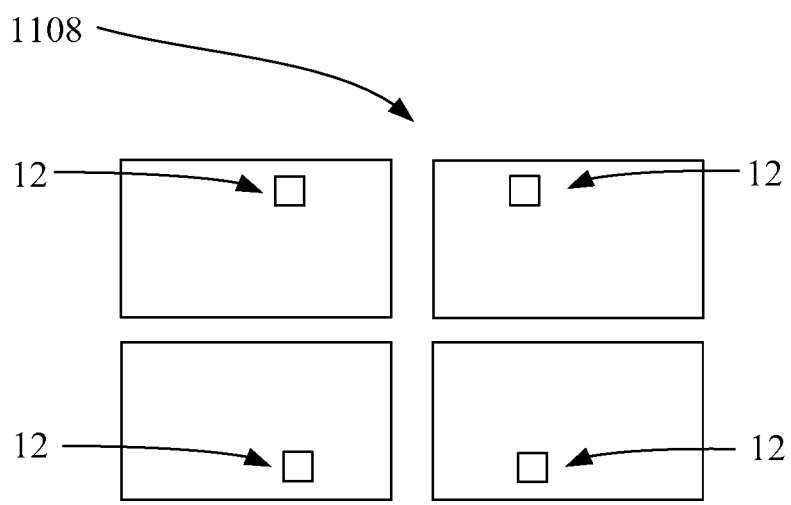
FIG. 13 is a schematic structure diagram of a metal anode layer according to an embodiment of the present disclosure.

FIG. 13 is a schematic structure diagram of a metal anode layer according to an embodiment of the present disclosure. As shown in FIG. 13, a gap in the metal anode layer 1108 is a via hole 12 communicated with the second electrode layer 1106.

Figure 14:
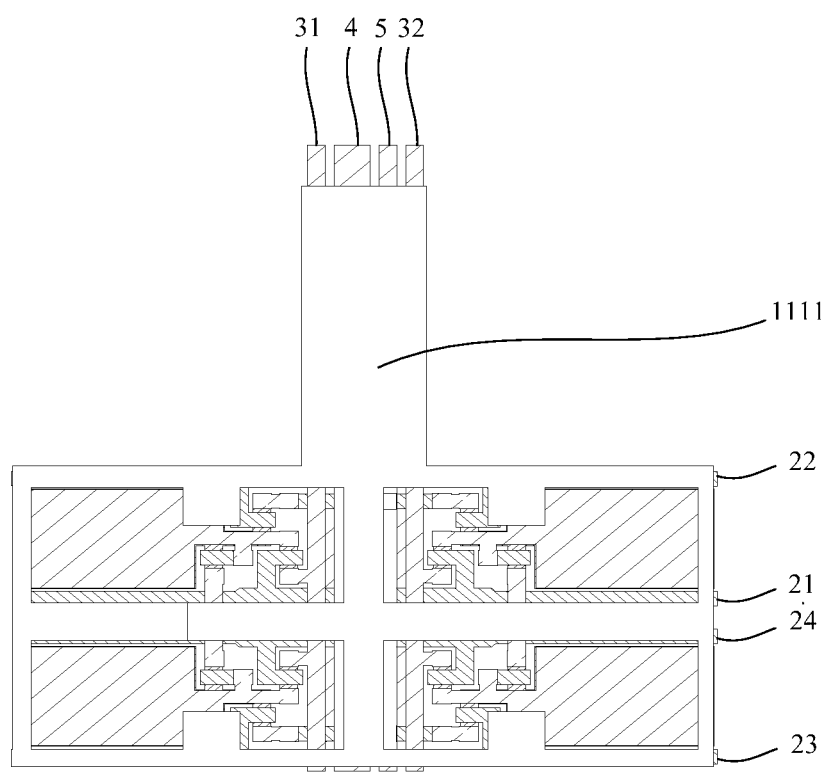
FIG. 14 is a schematic structure diagram of a black matrix layer of a transparent OLED display panel according to an embodiment of the present disclosure.

Optionally, the transparent OLED display panel according to the embodiment of the present disclosure may further include a black matrix layer. FIG. 14 is a schematic structure diagram of a transparent OLED display panel according to an embodiment of the present disclosure. Referring to FIGS. 3, 13 and 14, in an exemplary embodiment, the black matrix layer 1111 shields the part of the pixel 1 with metal traces except the portion shielded by the corresponding metal anode 1108 to prevent light leakage.

Referring to FIG. 9 again, in the embodiment of the present disclosure, the transparent region a includes a base substrate 1101, a gate insulating layer 1103, an interlayer insulating layer 1105 and a passivation layer 1107 which are sequentially laminated. The base substrate 1101, the gate insulating layer 1103, the interlayer insulating layer 1105 and the passivation layer 1107 in the transparent region a and all corresponding film layers in the display region b may be manufactured simultaneously and arranged on the same layer. The difference may be that some film layers have different thicknesses. For example, the gate insulating layer 1103 and the interlayer insulating layer 1105 in the transparent region a are thicker than the same film layers in the display region b.

Optionally, each sub-pixel 11 further includes at least one of a planarizing layer 1109 and a buffer layer 1110. The planarizing layer 1109 is disposed between the passivation layer 1107 and the metal anode layer 1108, and the buffer layer 1110 is disposed between the base substrate 1101 and the active layer 1102. The buffer layer 1110 is usually a $SiO_2$ and $SiN_x$ layer, and may prevent metal ions in a glass substrate from entering polysilicon, thereby avoiding influence on the performance of the thin film transistor. The planarizing layer 1109 is usually a resin layer to ensure the flatness between the metal anode and the passivation layer 1107 of the OLED.

Optionally, the base substrate 1101 is a transparent substrate, such as a glass substrate. The active layer 1102 is made of at least one material selected from InGaZnO, InGaO, ITZO and AlZnO. The gate insulating layer 1103 may be made of an insulating material such as silicon nitride and silicon oxide. The interlayer insulating layer 1105 may be made of an insulating material such as silicon nitride and silicon oxide. The passivation layer 1107 may be of a composite layer structure composed of any combination of two or more of silicon oxide, silicon nitride and a silicon compound.

The embodiments of the present disclosure further provide a method for manufacturing a transparent OLED display panel. The method includes: obtaining the transparent OLED display panel having a plurality of transparent regions and a plurality of display regions by forming a plurality of pixels and a plurality of data lines on a base substrate, the display regions being alternately arranged with the transparent regions in a first direction. The pixels are disposed in the display regions; pixels in the same display region are arranged in a second direction; and the data lines extend along the first direction which intersects with the second direction. Each of the pixels includes a plurality of sub-pixels; the sub-pixels disposed in the same display region include a row of first sub-pixels including a plurality of first sub-pixels arranged in the second direction and a row of second sub-pixels including a plurality of second sub-pixels arranged in the second direction; and the pixel at least includes one first sub-pixel and one second sub-pixel adjacent to each other in the first direction. The first sub-pixel and the second sub-pixel adjacent to each other in the first direction in the same display region are connected to the same data line; and different data lines connected to different first sub-pixels.

Figure 15:
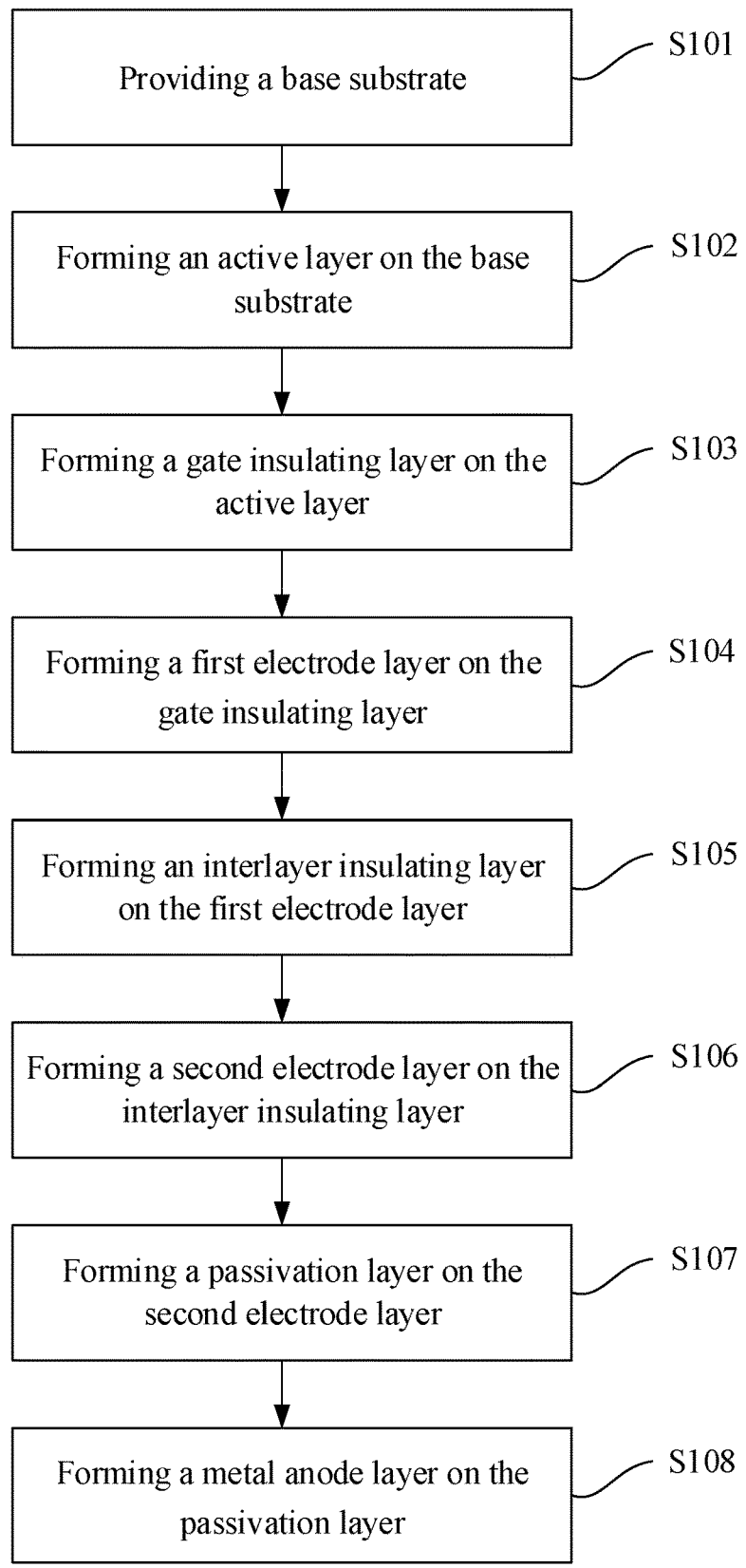
FIG. 15 is a schematic flowchart of a method for manufacturing a transparent OLED display panel according to an embodiment of the present disclosure.

FIG. 15 is a schematic flowchart of a method for manufacturing a transparent OLED display panel according to an embodiment of the present disclosure. As shown in FIG. 15, the method for manufacturing the transparent OLED display panel may include the following steps.

In S101, a base substrate is provided.

The base substrate is a transparent substrate, such as a glass substrate.

In S102, an active layer is formed on the base substrate.

In S102, an active material thin film may be formed on the base substrate in advance, for example, by deposition. The material of the active material thin film may be at least one of InGaZnO, InGaO, ITZO and AlZnO.

Then, a pattern of the active layer 1102 as shown in FIG. 10 is acquired by patterning the active material thin film. After the pattern of the active layer 1102 is acquired, part of a region in the active layer 1102 may be metalized such that the metalized region forms a conductor which may be used as one electrode plate of the capacitor c, the source S2 of the second thin film transistor T2 and the drain D3 of the third thin film transistor T3.

The metallization may be implemented through the following way. The metallization is performed in a reducing atmosphere at 100° C. to 300° C. for 30 min to 120 min, wherein the reducing atmosphere includes hydrogen or hydrogen-containing plasma. Performing the reduction reaction in the reducing atmosphere at 100° C. to 300° C. for 30 min to 120 min can best ensure that a region in the active material thin film not covered by an etching barrier layer is fully and effectively reduced to form a metal oxide conductor. If the temperature is too low, the reduction effect of the reduction reaction is adversely affected, the reaction time is prolonged, and the production efficiency is reduced. If the temperature is too high, it is likely to cause chemical action in the region covered by the etching barrier layer that does not need metallization, adversely affecting the performance of the structure. Similarly, if the reaction time is too short, the reduction reaction cannot be performed sufficiently; or if the reaction time is too long, the production efficiency is reduced.

In S103, a gate insulating layer is formed on the active layer.

In an exemplary embodiment, referring to FIG. 9 again, the gate insulating layer 1103 may be formed by vapor deposition. The gate insulating layer 1103 may be made of an insulating material such as silicon nitride and silicon oxide.

In S104, a first electrode layer is formed on the gate insulating layer.

The structure of the first electrode layer is shown in FIG. 12, and is not repeated herein.

In S105, an interlayer insulating layer is formed on the first electrode layer.

The interlayer insulating layer 1105 may be formed in the same manner as the gate insulating layer 1103. The interlayer insulating layer 1105 may be made of the insulating material such as silicon nitride and silicon oxide.

In S106, a second electrode layer is formed on the interlayer insulating layer.

The structure of the second electrode layer is shown in FIG. 12, and is not repeated herein.

In S107, a passivation layer is formed on the second electrode layer.

In an exemplary embodiment, the passivation layer 1107 may be of a composite layer structure composed of any combination of two or more of silicon oxide, silicon nitride and a silicon compound.

In S108, a metal anode layer is formed on the passivation layer.

The structure of the metal anode layer is shown in FIG. 13, and is not repeated herein.

It should be noted that the regions that need to be connected between different pattern layers may be connected through via holes. Therefore, in S102, S105 and S107, the via holes may also be formed in the formed interlayer insulating layer 1105 and passivation layer 1107.

A display apparatus is provided according to an embodiment of the present disclosure, and includes the transparent OLED display panel as described in FIGS. 2 to 9.

The transparent OLED display panel in the display apparatus divides the sub-pixels in one pixel into two rows, and the sub-pixels in the same column share one data line. In this way, the number of the data lines used by one pixel is less than the number of the sub-pixels included in the pixel. Compared with the prior art, the number of the data lines is reduced. On the one hand, the number of the data lines passing through the transparent regions is reduced, such that the area ratio of the transparent regions in the display panel can be increased. On the other hand, an area of the display regions occupied by the data lines is reduced, such that more sub-pixels can be arranged in the display regions, thereby improving the resolution.

In the embodiments of the present disclosure, the display apparatus includes, but is not limited to, a mobile phone, a tablet computer, a notebook computer, and the like.

A method for driving the transparent OLED display panel as shown in FIGS. 2 to 9 is further provided according to an embodiment of the present disclosure. The transparent OLED display panel displays a picture frame by frame when in work. During the process of displaying the picture of each frame, it is displayed in a row-by-row scanning way. The driving method may include the following steps.

Thin film transistors for display in each row of sub-pixels are controlled to be turned on row by row in a display phase.

When the thin film transistors for display in the row of the sub-pixels are turned on, luminance of each sub-pixel of the row of sub-pixels is controlled by writing a data signal to the sub-pixel.

Here, the thin film transistor for display is the above first thin film transistor T1.

Figure 16:
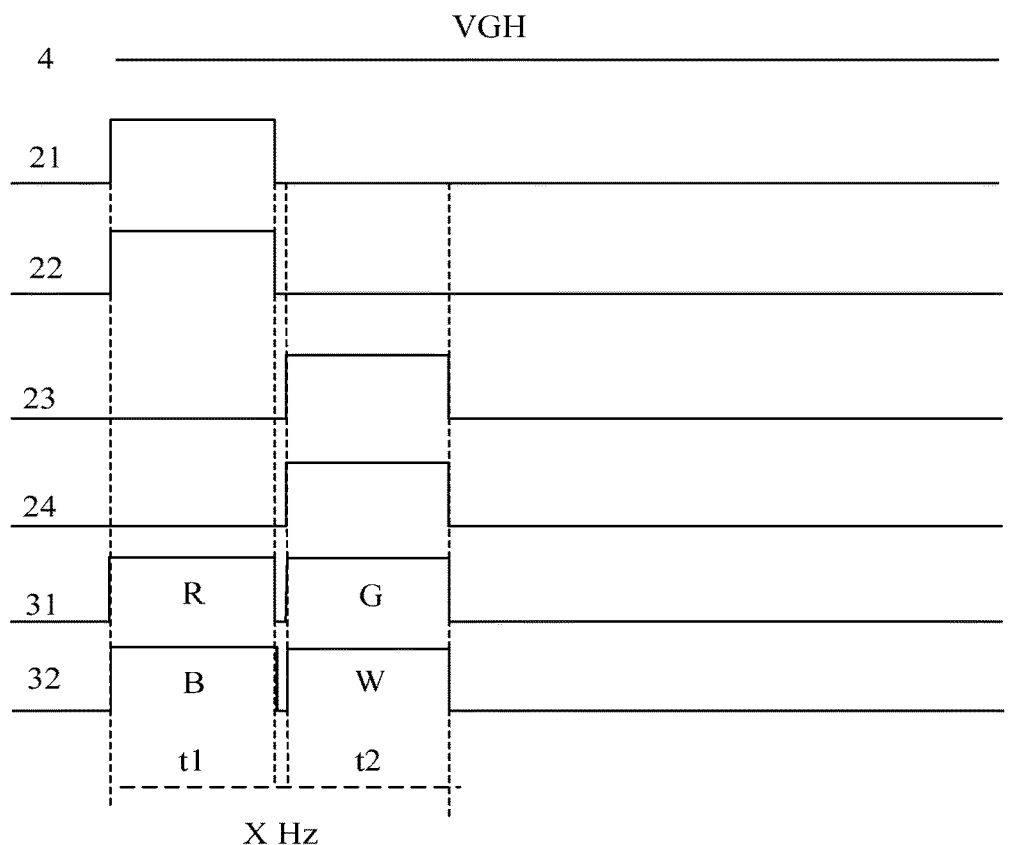
FIG. 16 is a driving timing diagram of a display stage according to an embodiment of the present disclosure.

FIG. 16 is a driving timing diagram of a display stage according to an embodiment of the present disclosure. As shown in FIG. 16, in combination with FIGS. 2 to 4, in the embodiment of the present disclosure, the pixel 1 shown in FIG. 4 as the target pixel 1 is taken as an example, wherein
the frequency of XHz, in the first time period t1, a scanning signal is provided for the first gate line 21, and data signals are provided for the first data line 31 and the second data line 32.

The gates of the two first thin film transistors T1 in the red and blue first sub-pixels 111 disposed in the second direction acquire the scanning signals from the first gate line 21, and the sources S1 of the two first thin film transistors T1 acquire the data signals from the first data line 31 and the second data line 32, respectively. The gate G2 of the second thin film transistor T2 acquires the data signal from the drain D1 of the first thin film transistor T1, and the drain D2 of the second thin film transistor T2 acquires the power signal from the power line 4, thereby driving the organic light-emitting diode d connected to the source S2 of the second thin film transistor T2 to emit light. The two first sub-pixels 111 display red and blue colors, respectively.

In the second time period t2, the scanning signal is provided for the fourth gate line 24, the data signals are provided for the first data line 31 and the second data line 32, and driving circuits in green and white second sub-pixels 112 disposed in the second direction control the light-emitting diodes d to emit light through the same process, such that the two second sub-pixels 112 display the green and white colors, respectively.

In the display stage, although the third thin film transistor T3 is turned on, the sub-pixel does not charge the sensing line at this stage due to the signal control of the sensing line 5, ensuring normal display.

Optionally, during the display time of one frame of the picture, a sensing phase is further provided after the display phase, and is configured to sense a voltage value of the sub-pixel for compensation. The driving method may further include the following steps.

Thin film transistors for sensing in each row of sub-pixels are controlled to be turned on row by row in the sensing phase. Here, the thin film transistor for sensing is the third thin film transistor T3.

When the thin film transistors for sensing in the row of the sub-pixels are turned on in the sensing phase, an electrical signal of each of the sub-pixels is sensed through the sensing line. Based on the electrical signal, an external integrated circuit may calculate a compensation value to compensate the voltage of the sub-pixel.

Figure 17:
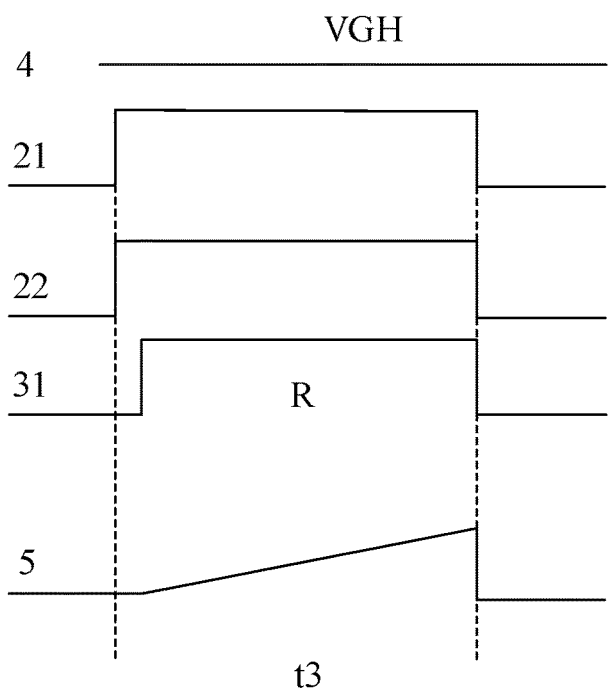
FIG. 17 is a driving timing diagram of a sensing phase according to an embodiment of the present disclosure.

FIG. 17 is a driving timing diagram of a sensing phase according to an embodiment of the present disclosure. As shown in FIG. 17, in combination with FIGS. 2 to 4, the red first sub-pixel 111 as the target sub-pixel 111 is taken as an example, wherein
in the third time period t3, scanning signals are provided for the first gate line 21 and the second gate line 22, and the first thin film transistor T1 and the third thin film transistor T3 are turned on.

The first data line 31 provides a first low-level signal for the red first sub-pixel 111. The low-level signal is lower than a turn-on voltage of the second thin-film crystal T2 of the first sub-pixel 111, and may be, for example, 2V Thus, the second thin film transistor T2 cannot be turned on. The low-level signal provided by the first data line 31 enters the sensing line 5 through the capacitor c and the third thin film transistor T3. At this time, the red first sub-pixel 111 charges the sensing line 5, and thus, a compensation voltage of the first sub-pixel 111 can be calculated.

Similar to the first data line 31, the second data line 32 provides a second low-level signal for the blue first sub-pixel 111, such that the blue first sub-pixel 111 charges the corresponding sensing line 5.

It should be noted that the above process is only the sensing process for one row of sub-pixels in the sensing stage, and sensing modes of other rows of the sub-pixels are the same as this this sensing process, and are repeated by the present disclosure herein.

Described above are merely exemplary embodiments of the present disclosure, and are not intended to limit the present disclosure. Within the spirit and principles of the present disclosure, any modifications, equivalent substitutions, improvements, and the like are within the protection scope of the present disclosure.

What is claimed is:

1. A transparent OLED display panel comprising a plurality of transparent regions and a plurality of display regions, wherein the transparent regions and the display regions are alternately arranged in a first direction, and
the transparent OLED display panel comprising:
a plurality of pixels and a plurality of data lines, wherein the pixels are disposed in the display regions, pixels in the same display region are arranged in a second direction, and the data lines extend along the first direction which intersects with the second direction; wherein
each of the pixels comprises a plurality of sub-pixels, sub-pixels in the same display region comprise a row of first sub-pixels comprising a plurality of first sub-pixels arranged in the second direction and a row of second sub-pixels comprising a plurality of second sub-pixels arranged in the second direction, and each of the pixels at least comprises one first sub-pixel and one second sub-pixel adjacent to each other in the first direction;
in the same display region, a first sub-pixel and a second sub-pixel adjacent to each other in the first direction are connected to the same data line, and different data lines connected to different first sub-pixels;

each of the display regions comprises a plurality of sub-pixel groups arranged in the second direction, each of the sub-pixel groups comprising two sub-pixel pairs adjacent to each other in the second direction, and each sub-pixel pair comprising one first sub-pixel and one second sub-pixel adjacent to each other in the first direction; and two data lines connected to the two sub-pixel pairs are disposed between the two sub-pixel pairs in each of the sub-pixel groups;

the transparent OLED display panel further comprises a plurality of power lines extending along the first direction, wherein first sub-pixels and second sub-pixels in the same sub-pixel group are connected to the same power line, each of the sub-pixel groups is connected to a corresponding power line via a connecting line, the connecting line is disposed in a laver different from a laver in which the corresponding power line is disposed, and an extending direction of the connecting line is perpendicular to the power line; and the corresponding power line connected to each of the sub-pixel groups is disposed between two data lines connected to the sub-pixel group.

2. The transparent OLED display panel according to claim 1, wherein each of the pixels comprises four sub-pixels, and the sub-pixels in each of the sub-pixel groups are from the same pixel.

3. The transparent OLED display panel according to claim 1, wherein each of the pixels comprises three sub-pixels, and the sub-pixels in each of the sub-pixel groups are from two adjacent pixels.

4. The transparent OLED display panel according to claim 1, further comprising a plurality of gate lines extending in the second direction, wherein each row of the first sub-pixels and each row of the second sub-pixels are respectively connected to at least one gate line.

5. The transparent OLED display panel according to claim 4, wherein each of first sub-pixels in the row of the first sub-pixels is connected to two of the gate lines, and the row of the first sub-pixels is disposed between the two gate lines connected to the first sub-pixels; and each of second sub-pixels in the row of the second sub-pixels is connected to two of the gate lines, and the row of the second sub-pixels is disposed between the two gate lines connected to the second sub-pixels.

6. The transparent OLED display panel according to claim 1, wherein a power line connected to a first sub-pixel group is disposed between two data lines connected to the first sub-pixel group, the first sub-pixel group being any one of the sub-pixel groups.

7. The transparent OLED display panel according to claim 1, further comprising a plurality of sensing lines extending along the first direction, wherein first sub-pixels and second sub-pixels in each of the sub-pixel groups are connected to the same sensing line.

8. The transparent OLED display panel according to claim 7, wherein a sensing line connected to a second sub-pixel group is disposed between two data lines connected to the second sub-pixel group, the second sub-pixel group being any one of the sub-pixel groups.

9. The transparent OLED display panel according to claim 1, wherein each of the sub-pixels comprises a first thin film transistor, a second thin film transistor, a capacitor and an OLED, wherein a gate of the first thin film transistor is electrically connected to a corresponding gate line, and a source of the first thin film transistor is electrically connected to a corresponding data line, and a drain of the first thin film transistor is electrically connected to a gate of the second thin film transistor and one terminal of the capacitor;

a drain of the second thin film transistor is electrically connected to a corresponding power line, and a source of the second thin film transistor is electrically connected to an anode of the OLED; and the anode of the OLED is electrically connected to the other terminal of the capacitor.

10. The transparent OLED display panel according to claim 9, wherein each of the sub-pixels further comprises a third thin film transistor, gates of third thin film transistors of sub-pixels in the same row are connected to the same gate line, and for any row of the sub-pixels, gate lines connected to the third thin film transistor and the first thin film transistor are different; and a drain of the third thin film transistor is electrically connected to the other terminal of the capacitor and the source of the second thin film transistor, and a source of the third thin film transistor is electrically connected to a corresponding sensing line.

11. The transparent OLED display panel according to claim 10, wherein each of the sub-pixels comprises an active layer, a gate insulating layer, a first electrode layer, an interlayer insulating layer, a second electrode layer, a passivation layer and a metal anode layer which are sequentially laminated on a base substrate, the metal anode layer and the second electrode layer being connected through a via hole.

12. The transparent OLED display panel according to claim 11, wherein the source of the second thin film transistor is in the active layer, and the drain of the third thin film transistor is in the active layer.

13. The transparent OLED display panel according to claim 11, wherein each of the sub-pixels further comprises at least one of a planarizing layer and a buffer layer, the planarizing layer being disposed between the passivation layer and the metal anode layer, and the buffer layer being disposed between the base substrate and the active layer.

14. The transparent OLED display panel according to claim 9, wherein the display panel in the transparent region comprises a base substrate, and a gate insulating layer, an interlayer insulating layer and a passivation layer which are sequentially laminated on the base substrate.

15. A display apparatus comprising the transparent OLED display panel according to claim 1.

16. The display apparatus according to claim 15, wherein each of the pixels comprises four sub-pixels, and the sub-pixels in each of the sub-pixel groups are from the same pixel.

17. The display apparatus according to claim 15, wherein each of the pixels comprises three sub-pixels, and the sub-pixels in each of the sub-pixel groups are from two adjacent pixels.

18. The display apparatus according to claim 15, wherein the transparent OLED display panel further comprises a plurality of gate lines extending in the second direction, wherein each row of the first sub-pixels and each row of the second sub-pixels are respectively connected to at least one gate line.

19. The display apparatus according to claim 15, wherein each of first sub-pixels in the row of the first sub-pixels is connected to two of the gate lines, and the row of the first sub-pixels is disposed between the two gate lines connected to the first sub-pixels; and each of second sub-pixels in the row of the second sub-pixels is connected to two of the gate lines, and the row of the second sub-pixels is disposed between the two gate lines connected to the second sub-pixels.

20. A method for manufacturing a transparent OLED display panel, comprising:

forming a plurality of pixels and a plurality of data lines on a base substrate to obtain a transparent OLED display panel having a plurality of transparent regions and a plurality of display regions, the display regions and the transparent regions being alternately arranged in a first direction, wherein the pixels are disposed in the display regions, pixels in the same display region are arranged in a second direction, and data lines extend along the first direction which intersects with the second direction;

each of the pixels comprises a plurality of sub-pixels, sub-pixels in the same display region comprise a row of first sub-pixels comprising a plurality of first sub-pixels arranged in the second direction and a row of second sub-pixels comprising a plurality of second sub-pixels arranged in the second direction, and each of the pixels at least comprises one first sub-pixel and one second sub-pixel adjacent to each other in the first direction;

in the same display region, a first sub-pixel and a second sub-pixel adjacent to each other in the first direction are connected to the same data line, and different data lines connected to different first sub-pixels;

each of the display regions comprises a plurality of sub-pixel groups arranged in the second direction, each of the sub-pixel groups comprising two sub-pixel pairs adjacent to each other in the second direction, and each sub-pixel pair comprising one first sub-pixel and one second sub-pixel adjacent to each other in the first direction; and two data lines connected to the two sub-pixel pairs are disposed between the two sub-pixel pairs in each of the sub-pixel groups;

the transparent OLED display panel further comprises a plurality of power lines extending along the first direction, wherein first sub-pixels and second sub-pixels in the same sub-pixel group are connected to the same power line, each of the sub-pixel groups is connected to a corresponding power line via a connecting line, the connecting line is disposed in a layer different from a layer in which the corresponding power line is disposed, and an extending direction of the connecting line is perpendicular to the power line; and the corresponding power line connected to each of the sub-pixel groups is disposed between two data lines connected to the sub-pixel group.

* * * * *